United States Patent [19]

Bednorz et al.

[11] Patent Number: 5,648,321

[45] Date of Patent: Jul. 15, 1997

[54] PROCESS FOR MANUFACTURING THIN FILMS BY MULTI-LAYER DEPOSITION

[75] Inventors: Johannes Georg Bednorz, Wolfhausen; Andrei Catana, Preverenges; Jean Pierre Locquet, Kilchberg; Erich Maechler, Siebnen; Carl Alexander Mueller, Hedingen, all of Switzerland

[73] Assignee: International Business Machines Corporation, Armonk, N.Y.

[21] Appl. No.: 120,984

[22] Filed: Sep. 13, 1993

[30] Foreign Application Priority Data

Sep. 11, 1992 [EP] European Pat. Off. ............ 92810699

[51] Int. Cl.[6] ............... B05D 5/12; C23C 14/00; C23C 16/00

[52] U.S. Cl. ............ 505/473; 505/474; 505/475; 505/500; 505/729; 505/731; 505/732; 505/742; 427/62; 427/255.7; 427/596

[58] Field of Search ............ 505/729, 473, 505/474, 475, 731, 732, 734, 742, 500; 117/108; 427/62, 255.7, 596

[56] References Cited

PUBLICATIONS

Webb et al, "Growth of high Tc superconducting thin films using molecular beam epitaxy techniques", Appl. Phys. lett. 51(15) Oct. 1987, pp. 1191–1193.

Bae et al, "Molecular beam deposition of $Dy_1 Ba_2 Cu_3 O_{7-\delta}$ (001) high–temperature superconductor thin films", J. Vac. Sci. Technol. A 10(2) Mar./Apr. 1992 pp. 281–283.

Hellman et al, "Molecular–beam epitaxy and deposition of high Tc superconductors", J. Vac. Sci. Technol. B6(2) Mar./Apr. 1988 pp. 799–803.

*Primary Examiner*—Roy V. King
*Attorney, Agent, or Firm*—Daniel P. Morris

[57] ABSTRACT

Described is a process for manufacturing thin films by periodically depositing (DEP) a number of block layers consisting of different base materials on a substrate (multilayer deposition), wherein the thickness of the layers (LT) is restricted to one to 20 monolayers and deposition as well as crystallization of the thin film is completed at approximately constant temperature without performing a separate annealing step. The method can be used to produce thin films of high-$T_c$-superconductors. It allows a better control of the crystal growth of ternary or higher compounds with comparatively large unit cells.

7 Claims, 6 Drawing Sheets

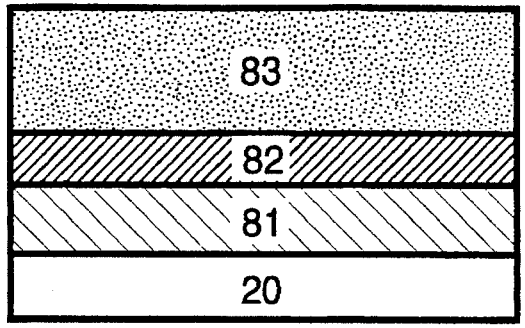
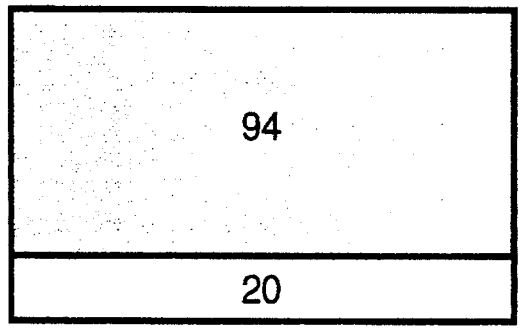
FIG. 8        FIG. 9
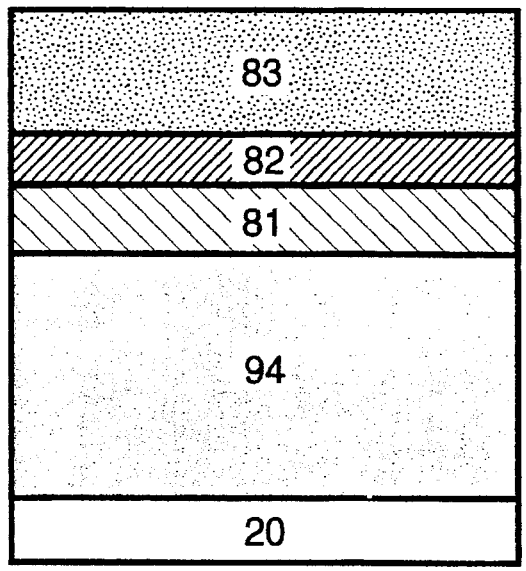
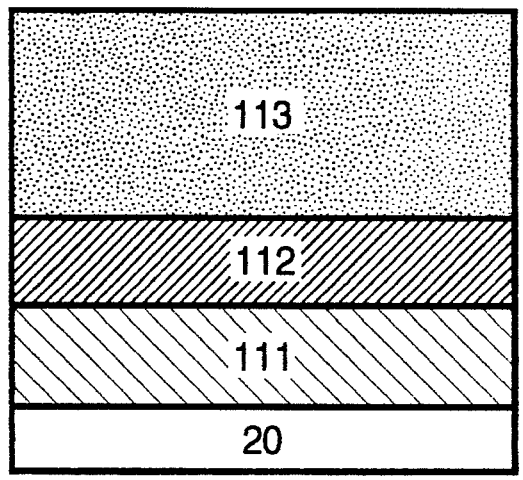
FIG. 10       FIG. 11

PROCESS FOR MANUFACTURING THIN FILMS BY MULTI-LAYER DEPOSITION

TECHNICAL FIELD

The present invention relates to a process for manufacturing solid compounds of three or more different base materials. More particularly, it relates to a method for manufacturing high-$T_c$-superconductors as thin films.

BACKGROUND OF THE INVENTION

Recently, there have been intense research and development activities on the possible uses of high-$T_c$-superconductor materials. For example, high-$T_c$-superconductors were found useful in applications such as semiconductor devices and circuit interconnections. Accordingly, there are now demands for methods for producing uniform high-$T_c$-superconductor layers combining a satisfactory quality with high efficiency.

Conventional methods for the manufacture of compounds, especially superconductors consisting of three base materials, so-called ternary compounds, are described in a great number of publications, e.g. EP-A-0450394, EP-A-0444698, EP-A-0299870, EP-A-0426570 and EP-A-0446789. Films of high-$T_c$-superconductor material are usually deposited on a suitable substrate, in most cases on the clean surface of a single crystal. Often the substrate is additionally covered by a buffer layer to avoid interactions between substrate and deposited layers and to facilitate crystal growth in a defined orientation. Deposited onto said substrate or buffer layer are layers of base material, selected to form the high-$T_c$-superconductor, using a variety of techniques like sputtering, laser ablation, co-evaporation and monolayer-by-monolayer deposition. These deposition techniques can roughly be divided into two different categories: either all materials necessary to build up the unit cell of the compound are deposited simultaneously, or the different base materials are deposited consecutively by piling up monolayers of the different base materials. As understood herein, a unit cell of an ideal crystal is an identical volume which completely fills the space of the crystal without any overlapping. A monolayer is the amount of an element or compound necessary to cover the entire surface of a substrate with a layer of single atoms or molecules, respectively.

Both deposition techniques, as described above, are not satisfactory with regard to impurities and defects of the resulting high-$T_c$-superconductor material. These faults cause an undesired decrease in the mechanical and electrical properties of the grown crystal structure of the superconductor.

The multilayer deposition technique is known from various publications (Y. Sorimachi et al., Jap. Journal of Appl. Phys.26(9), 1987, pp.L1451–L1452; B.-Y. Tsaur et al., Appl. Phys. Lett. 51(11), 1987, pp.858–860; Z. L. Bao et al., Appl. Phys. Lett. 51(12), 1987, pp.946–947; C.X. Qiu et al., Appl. Phys. Lett. 52(7), 1988, pp.587–589; N. Hess et al., Appl. Phys. Lett. 53(8), 1988, pp.698–699; X. K. Wang et al., Appl. Phys. Lett. 54(16), 1989, pp.1573–1575). This technique is characterized by sequentially depositing layers of suitable base materials onto a heated substrate. In contrast to the monolayer-by-monolayer technique, the thickness of the layers is determined by the stoichiometric ratio of the compound to be produced. Usually the thickness of a single layer lies within a range from 8 nm to 100 nm, corresponding to 30 to over 300 monolayers. The layers of different base materials are combined to a period of layers, a number of which may be repeatedly deposited until the desired thickness of the film is reached. The known multilayer deposition of thick layers requires an annealing step, during which the deposited layers are heated in an oxygen atmosphere. This annealing step is necessary to balance the deficiency in the oxygen content of the deposited layers to transform these layers into superconducting material. As the temperature of the substrate has to be increased substantially by more than 100 Kelvin, and often the vacuum chamber has to be changed to proceed, the known multilayer deposition technique is a relatively slow process. The annealing step further prevents an in-situ control over the growth of the desired compound.

It is, therefore, an object of the present invention to overcome the above-mentioned problems and to provide a new process based on the multilayer deposition to manufacture thin films of solid compounds having crystal structure with improved qualities. Another object of the invention is to provide a method for producing films of high-$T_c$-superconducting material showing an homogeneous crystal structure. It is a further object of the invention to provide a method for producing films having a smooth surface. Another important object of the invention is to eliminate the previously required annealing step from the manufacturing process of high-$T_c$-superconducting material.

SUMMARY OF THE INVENTION

The present invention provides a method for manufacturing thin films of solid compounds, especially high-$T_c$-superconductors, by an improved periodic multilayer deposition technique, wherein the layer thickness is reduced and the crystallization of the compound takes place at approximately the same temperature as the deposition of the layers and before depositing a further period of layers. The thickness of a layer is reduced to one to twenty, preferably to two to ten monolayers. This corresponds to layer thicknesses of approximately 0.3 nm to 6.0 nm, and 0.6 nm to 3.0 nm, respectively. The number of monolayers within a single layer does not necessarily have to be an integer. As a monolayer is primarily defined as an amount of material, it is possible to deposit layers consisting of a fractional number of monolayers, e.g. 1.5 monolayers. Such a layer is also hereinafter referred to as block layer or bulk layer. Referring to Bao et al., the deposition is called periodic. Thus, a period is a fixed number of block layers of different base materials being repeatedly deposited. These layers, preferably three to six, are sufficient to form the desired compound. It is nevertheless possible to manufacture a very thin film of the compound by depositing only one period of layers. But to manufacture more stable films, it is preferred to deposit at least two periods of layers.

Typical compounds preferably produced in accordance with the new method are ceramic superconductors. In particular, the method may be used to manufacture superconductors as listed in EP-A-0426570, page 3, 11. 36–55 and superconductors belonging to the "infinite layers" category, such as $Ca_{1-x}Sr_xCuO_y$, $Sr_{1-x}Ln_xCuO_y$ with Ln standing for an element selected from the lanthanides, including yttrium and lanthanum, $Ba_{1-x}Sr_xCuO_y$, compounds of the above-mentioned category including dopants selected from the group comprising C, N, F, and Cl, or electron doped superconductors.

The new method can also be used to produce selenides, phosphides, nitrides, arsenides, or tellurides of CuZn, CuIn, or similar compounds.

The stoichiometric ratio, also known as atomic ratio, defines the thickness ratio of the layers within one deposition period. For a compound having the stoichiometric ratio 1:2:3 (e.g. a $YBa_2Cu_3O_7$ high-$T_c$-superconductor) each deposition period will consist of a block layer or block of one or more monolayers of the first base material, a second block layer of twice as many monolayers of the second base material and a third block layer of the third base material consisting of thrice as many monolayers as the first block. Thus, instead of supplying the different elements simultaneously or sequentially as monolayers of different base materials, large blocks (the thickness of one to several monolayers) of each element are deposited sequentially. To allow a better diffusion through the blocks, it is advantageous to restrict the thickness of the block layer of the base material with the smallest portion in the compound to preferably to five or less monolayers. The upper limit of the thickness of the layer is selected according to the diffusion length of the mobile component. In order to prevent a time consuming deposition, it is further advantageous to deposit block layers of a thickness of at least two monolayers.

To achieve the desired thickness of the whole film, it may be necessary to repeat the deposition period, depending on the thickness of the block layers. However, it should be understood that each period in itself is sufficient for producing a layer of the desired compound almost free of impurities, compared with films produced by known techniques.

As the invention does not depend on any specific deposition method, it lies within the scope of any person skilled in the art to apply any of such methods. Methods well known in this technical field are for example sputtering, laser ablation, metal organic chemical vapor deposition (MOCVD), molecular beam epitaxy (MBE) and the like. It is advantageous to select the sequence of the layers with regard to their deposition and diffusion properties: preferably, the block of base material showing the best epitaxial growth on the surface of the substrate is applied first. The selection can be made according to suitable experiments or by selecting the base material with the smallest unit cell. Thus, a smooth covering of the substrate almost free of defects can be achieved. It is possible to avoid the usual buffer layer, which is placed between the substrate and the layers composing the desired compound, by selecting a base material which does not react with the substrate as starting layer. In this case, the first bulk layer or block serves as (intrinsic) buffer layer, itself.

The proper selection of the order in which the layers are deposited improves the control over the crystal growth of the solid compound. Within each deposition period, the blocks or layers having a small diffusion coefficient are preferably deposited first, and the block consisting of base material with the greatest diffusion coefficient or length is deposited last. Thus, the diffusion process, which leads to the forming of the desired compound, only starts when the last layer within each deposition cycle or period is deposited. In the production of copper-containing high-$T_c$-superconductors, Cu or its oxide is preferably chosen as last layer.

In contrast to the known methods, where either all base materials are deposited simultaneously or in subsequent monolayers of different base materials, in accordance with the new invention the crystallization process is initiated when all layers of one period, except the last, have been deposited with their correct stoichiometric ratio, i.e. the correct thickness by the start of the deposition of the last layer. Within one deposition period, the crystallization also ends with the last layer being deposited. As the last layer is also being deposited according to the correct stoichiometric ratio, the desired compound is accomplished without defects due to incorrect stoichiometry. Contrary to the monolayer-by-monolayer method, the crystallization of the desired compound starts and ends with the deposition of the last layer within the deposition period. As the deposition is carried out in the presence of a surplus amount of atomic oxygen, a separate annealing step, as used within the described multilayer deposition methods, becomes unnecessary. The desired compound, e.g. a superconductor, is formed without a significant change in temperature. Although in accordance with the present invention the temperature of the substrate or of the deposition chamber does not have to be changed at all, fluctuation of temperature in a range of up to ±10% around the deposition temperature is considered to lie within the scope of this invention. Abandoning the separate annealing step allows a continuous monitoring of the crystallization. Further, it is an advantage that the crystallization starts evenly across the entire surface of the layer. It was found that the method according to the invention provides an improved control over the crystal growth as already mentioned above. The growth direction is mainly vertical with only a small lateral component or even none at all in contrast to the lateral growth direction which characterizes other deposition techniques.

It may further be advantageous to combine two or more base materials to tailor a precompound with superior deposition and/or diffusion properties with regard to certain substrates or other deposited layers. The substrate itself may be magnesium oxide, aluminium oxide, strontium titanate, and the like. The substrate is heated to a temperature that depends on the materials used. At the currently used substrate temperatures for these materials (650°–750° C.), and for a limited size of the blocks (one to a few monolayers), diffusion is strong enough to allow building of the desired compound without performing an annealing step (raising the temperature, etc.). The vertical diffusion length should be of the order of the thickness of the deposited blocks.

If the formation of the compound material requires a relatively high deposition temperature, and if it has a relatively low melting temperature causing a primarily three-dimensional growth, i.e. a growth in all directions, then the new multilayer deposition method will allow the preparation of films with superior characteristics, provided that at least one of the elements forming the compound has a large diffusion coefficient at the desired temperature. The new process makes it possible to grow successive layers of solid compounds, preferable high-$T_c$-superconductors, having large unit cells. A large unit cell is characterized by the dimension of one main axis exceeding 1 nm or even 5 nm.

BRIEF DESCRIPTION OF THE DRAWINGS

The invention is described in detail below by way of example with reference to the drawings, which are schematic and not drawn to scale, while more particularly the dimensions of some parts are exaggerated for the sake of clarity.

FIG. 8 shows a period of layers deposited in accordance with the new deposition technique.

FIG. 9 shows the same period of layers as FIG. 8 after crystallization.

FIG. 10 shows the next period of layers, deposited in accordance with the new deposition technique on top of the crystallized period of layers of FIG. 9.

FIG. 11 shows a period of layers each consisting of a non-integer number of monolayers deposited in accordance with the new deposition technique.

DETAILED DESCRIPTION OF THE INVENTION

In the following, the invention is described in detail with reference to the drawings and the prior art.

Figure 1:
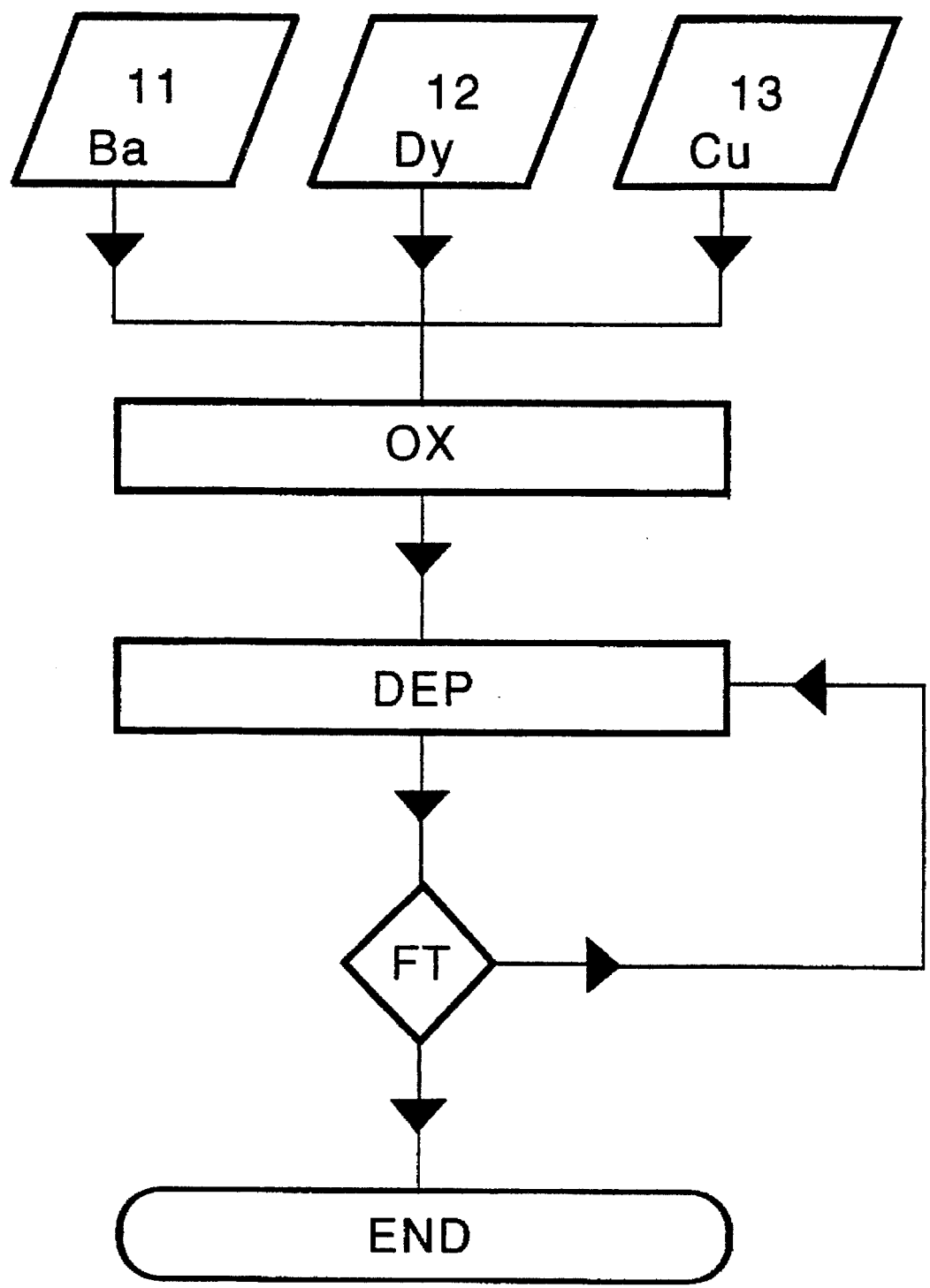
FIG. 1 (prior art) shows a flow-chart of the principle steps of the simultaneous deposition technique.
Figure 2:
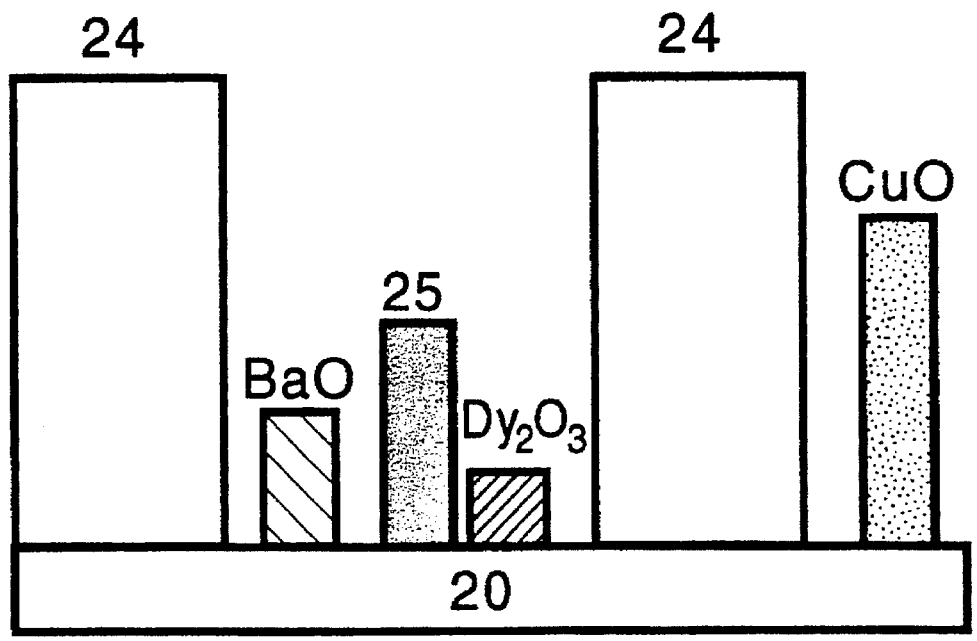
FIG. 2 (prior art) shows a cross section of the substrate and the deposited material during the deposition step of the simultaneous deposition technique.
Figure 3:
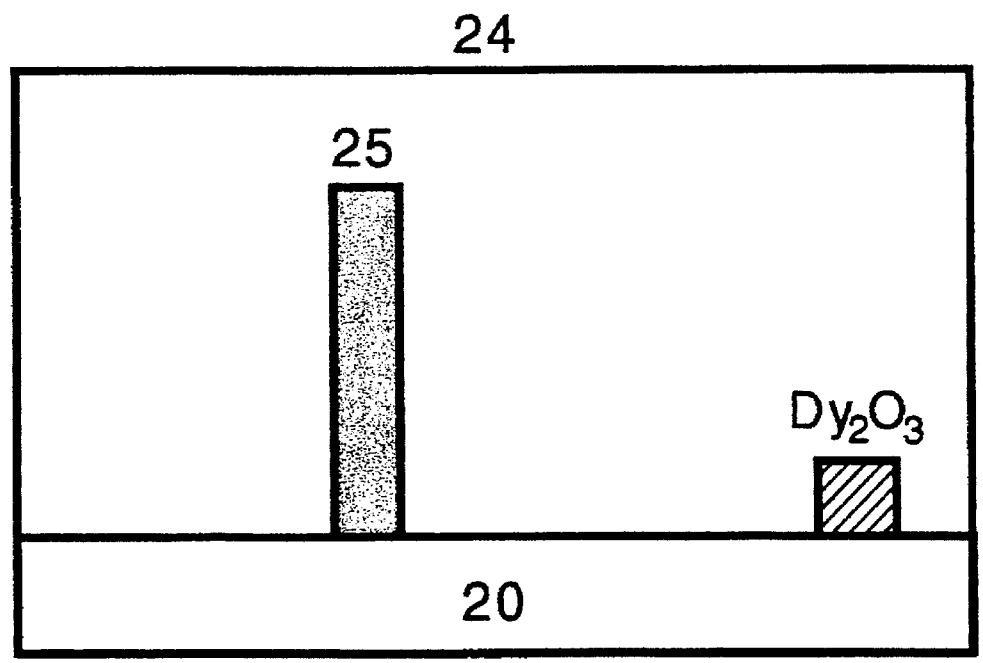
FIG. 3 (prior art) shows a cross section of the substrate and the deposited material after the deposition step of the simultaneous deposition technique.

FIGS. 1–3 describe the known simultaneous deposition technique. FIG. 1 shows a flow-chart of the process, whereas FIGS. 2 and 3 give a cross section of the substrate and the deposited material during (FIG. 2) and after (FIG. 3) the deposition step. In the simultaneous deposition technique, the base materials, in this case Ba, Dy, and Cu, are evaporated from one or several sources 11, 12, 13, oxidized (OX) by the oxygen atoms or molecules in the deposition chamber, and deposited simultaneously in the deposition stage of the process (DEP) onto a substrate 20. The deposition step ends when the desired thickness of the film (FT) is reached. During the simultaneous deposition step (DEP), the cross section (FIG. 2) reveals that besides the deposition of the oxidized base materials BaO, $Dy_2O_3$, and CuO, already a growth of the desired "1:2:3"-unit cell of the superconductor 24 ($DyBa_2Cu_3O_7$) takes place at favoured positions. At less favoured places, impurities 25 are found. These impurities are often other compounds of the base materials than the desired superconducting compound 24, which also grow during the deposition step. The impurities 25, therefore, may be called non-stoichiometric compounds. As indicated by FIG. 3, which shows a cross section after the end of the deposition step (DEP), the impurities 25 may survive the formation of the superconducting material 24 together with the remainder of some base material ($Dy_2O_3$), which may have stabilized itself on the substrate 20, resulting in an imperfect superconducting phase.

Figure 4:
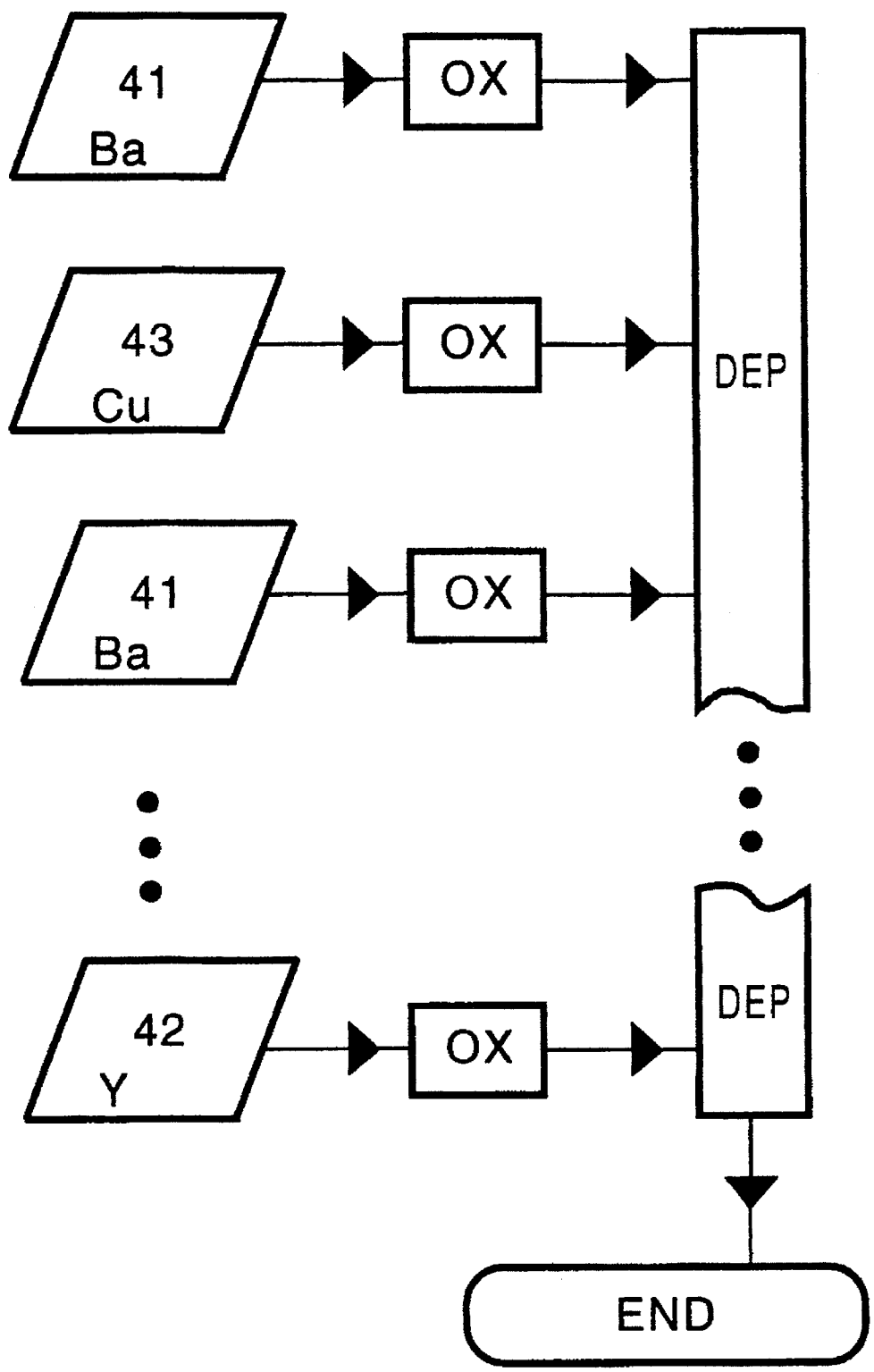
FIG. 4 (prior art) shows a flow-chart of the principle steps of the monolayer-by-monolayer technique.
Figure 5:
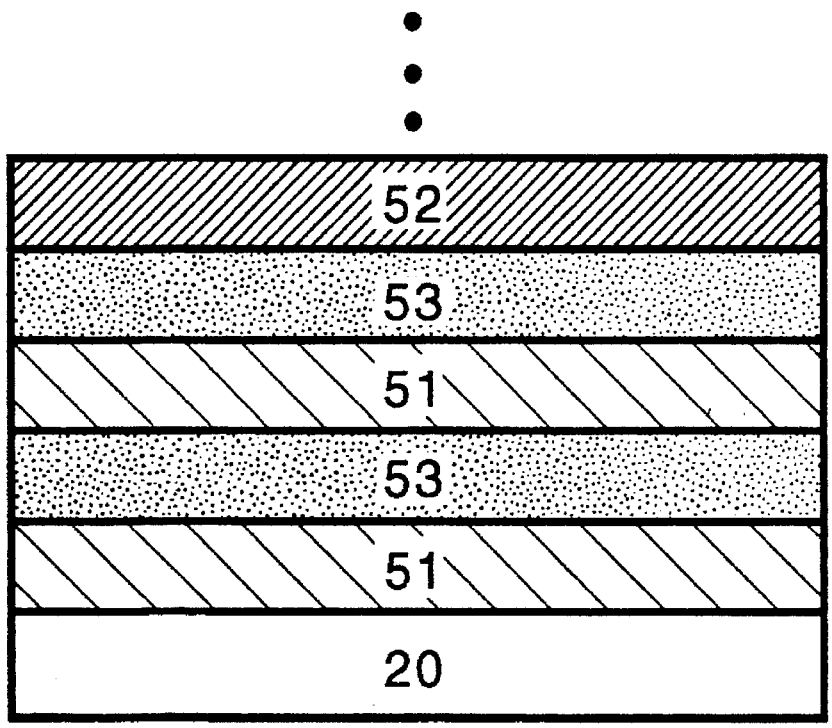
FIG. 5 (prior art) shows several monolayers deposited during the deposition step of the monolayer-by-monolayer technique.
Figure 6:
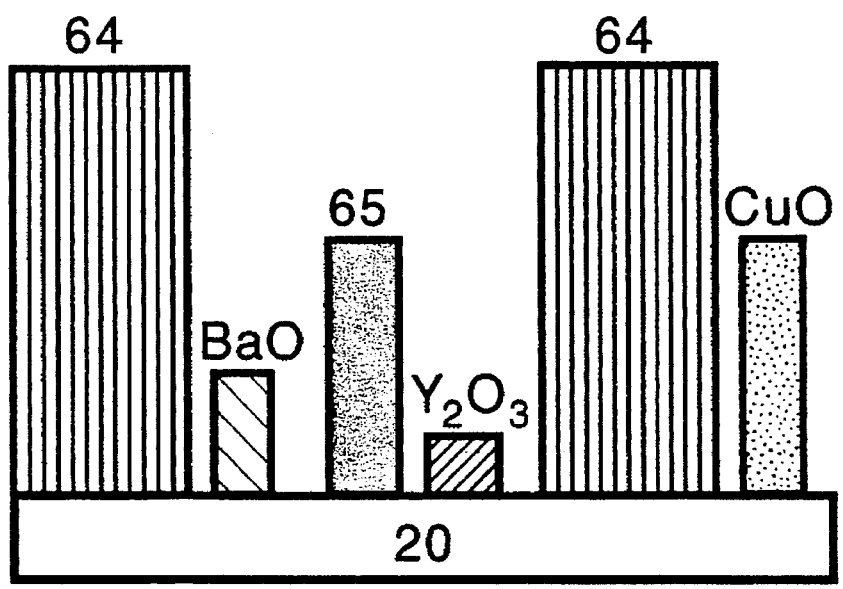
FIG. 6 (prior art) shows a cross section of the substrate and the deposited material after crystallization of the monolayers shown in FIG. 5 under the condition of an intermediate stoichiometric ratio, i.e. before all monolayers are deposited.

FIGS. 4–6 describe the known monolayer-by-monolayer deposition technique. FIG. 4 shows a flow-chart of the process; FIGS. 5 and 6 give a cross section of the substrate and the deposited material during the deposition step. A cross section after deposition like FIG. 3 in case of the simultaneous deposition method is omitted as it shows no basic differences with regard to that figure. The general monolayer-by-monolayer process is characterized by successively depositing monolayers 51, 52, 53 of different base materials onto a substrate 20. The flowchart (FIG. 4) denotes this deposition (DEP) without regarding the exact sequence of deposition for the sake of shortness. However, it should be understood that the sources 41, 42, 43 contribute in temporal order monolayers to the deposition process (DEP). The base material is oxidized (OX) during deposition by the oxygen present in the deposition chamber. Commonly, the sequence of the monolayers 51, 52, 53 is chosen in accordance with the sequence of the atomic layers within the unit cell of the desired superconductor. The deposition procedure (DEP) is terminated when the intended number of monolayers 51, 52, 53 has been deposited.

In the process to produce a "1:2:3"-unit cell described, but not shown, in EP-A-0426570, monolayers of BaO, CuO, BaO, CuO, $Y_2O_3$, CuO, BaO, CuO, and BaO, are deposited in that sequence. FIGS. 5 and 6 show intermediate states during the deposition step (DEP) with FIG. 6 showing the state immediately following the deposition of the first $Y_2O_3$ monolayer 52, i.e. following FIG. 5. In fact, both states can hardly be separated and are presented by two figures primarily for the sake of clarity. As already described above in the case of the simultaneous deposition, with the deposition of $Y_2O_3$, all base materials (or rather the oxides BaO, $Y_2O_3$, CuO) to form the superconductor 64 ($YBa_2Cu_3O_7$) are present on the surface of the substrate 20, though not simultaneously deposited, but as monolayers 51, 52, 53. Nevertheless, the unit cells of superconducting phase 64 are able to crystallize at favoured positions after depositing $Y_2O_3$, very much the same way as described above. Due to unfavourable stoichiometric conditions, other impurities may occur, too. After the deposition of the following sequence of monolayers: BaO 51-CuO53-BaO51-CuO53-$Y_2O_3$ 52 (i.e. a set of five monolayers out of the six composing a unit cell), discontinuous regions of the desired $YBa_2Cu_3O_7$ layer 64 are already formed on the substrate 20, as is evidenced by reflection high-energy electron diffraction (RHEED). The local composition present after deposition of these five monolayers is close enough to $YBa_2Cu_3O_7$ for the latter to nucleate and grow. But not enough material is deposited at this deposition stage to provide a complete coverage of the substrate 20. Consequently, a rough surface will be left with some impurities 65 due to non-stoichiometric growth. As this picture (FIG. 6) does not differ in essence from FIG. 3, these impurities 65 also will survive the later formation of the complete superconducting layer.

These defects are considerably lessened by the improved multilayer deposition, the process of which will be described below with reference to the flow-chart of FIG. 7. FIGS. 8 and 11 each show one period of deposited layers and FIG. 9 shows the layers of FIG. 8 after complete crystallization, i.e. when the substrate is covered by one layer of the superconducting compound with a height of one unit cell. FIG. 10 shows the layer of the superconducting material, onto which the next period of layers is deposited. What is said above concerning FIGS. 5 and 6, applies also to FIGS. 8 and 9: A definite distinction between the states illustrated by both figures is primarily made for sake of clarity and can hardly be made otherwise.

Figure 7:
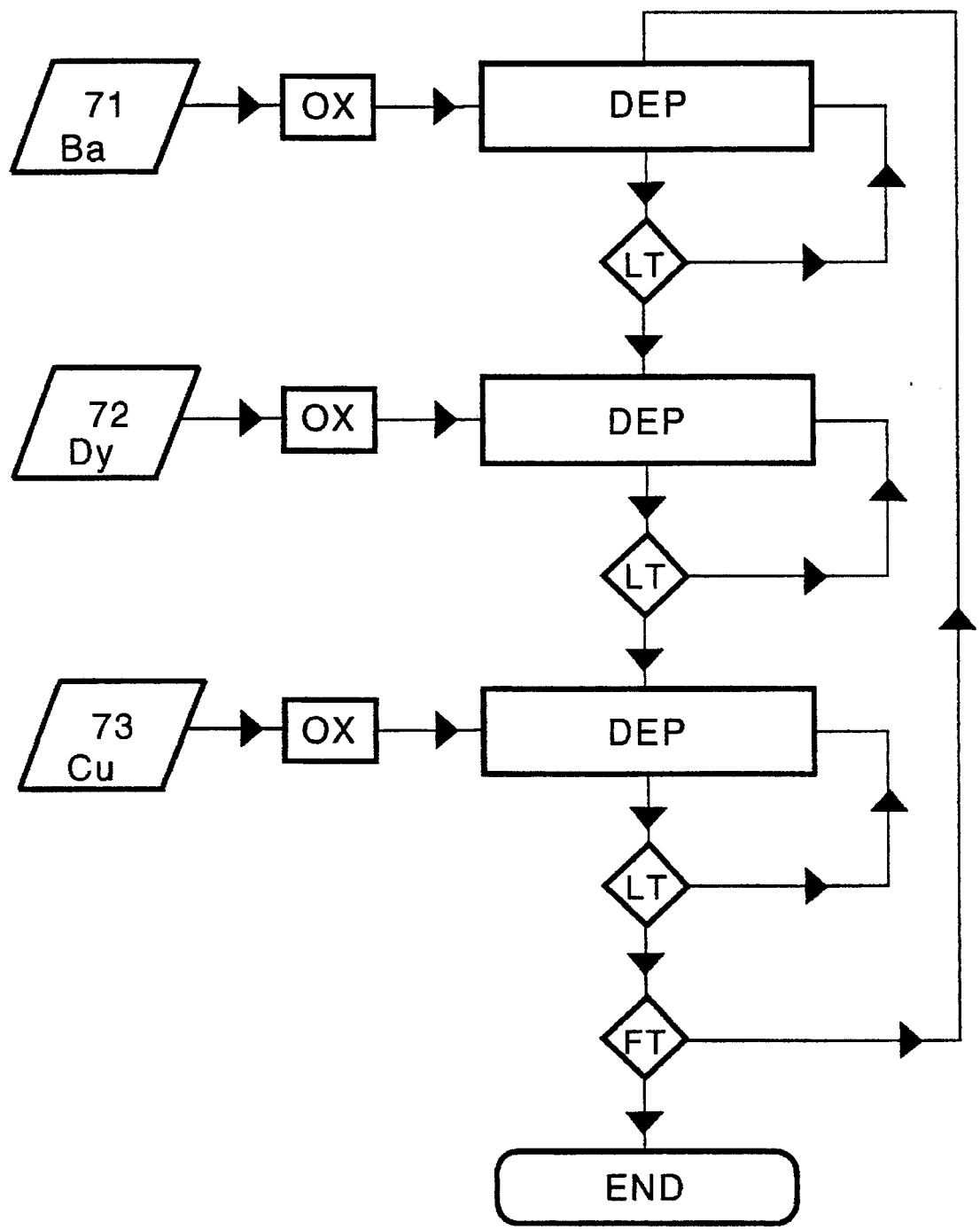
FIG. 7 shows a flow-chart of the principle steps of the new deposition technique in accordance with the invention.

As shown by FIG. 7 the base materials (Ba, Dy, Cu) are provided by sources 71, 72, 73. The deposition chamber is provided with enough oxygen achieve an oxidization (OX) of the base materials. Each base material is deposited (DEP) and oxidized (OX) with a layer thickness (LT) according to the stoichiometric ratio of the compound. The deposition of one layer of each base material, i.e. the deposition of one period, is repeated until the desired film thickness (FT) is reached. This method is found to suppress an intermediate, non-stoichiometric crystallization, which occurs applying the known methods (see above).

In the case of $DyBa_2Cu_3O_7$, a first block layer of BaO 81, a second block layer of $Dy_2O_3$ 82, and a third block layer of CuO 83 are deposited onto the substrate 20 one after another. In order to preserve the stoichiometry, the BaO layer 81 is composed of two BaO monolayers, followed by a $Dy_2O_3$ layer 82 of one monolayer, and finally a CuO block 83 of three monolayers. It is an advantage that these layers may serve in principle as a buffer layer. Since they are formed by the elements composing the desired compound, these buffer layers are intrinsic.

By first depositing on the substrate 20 a layer 81 of a simpler material (BaO) than the desired compound, the question of the nucleation of the complex compound is reduced to the question of the nucleation of a layer of the simpler material. A simpler material may have either a smaller unit cell, a higher melting point, fewer impurity phases in its phase diagram, or a combination of these items. A higher melting point will in general allow a growth mechanism which is more two-dimensional at the indicated substrate temperature.

For $DyBa_2Cu_3O_7$, the growth of a first (buffer) layer 81 of BaO proceeds entirely differently than the growth of a $DyBa_2Cu_3O_7$ block (as for example deposited by the simultaneous deposition, see above). BaO has a melting point of 1923° C., which is about 1000° C. higher than the melting point of the superconductor, and grows therefore at 700° C. close to a layer by layer manner. Since it has a relatively small unit cell and no impurities are found in its simple phase diagram, the eventually formed grains do not pose a serious problem upon joining together. As a consequence, the deposition of BaO as a buffer layer 81 composed of two BaO monolayers leaves a continuous and smooth film on the substrate. In the case of a $SrTiO_3$ substrate 20, the BaO film will grow epitaxially. The subsequent deposition of the $Dy_2O_3$ block layer 82, consisting of one monolayer, does not fundamentally change this picture since no intermediate impurity phase (e.g. $Ba_2DyO_x$) composition is formed, as the diffusion between both layers is small. At this point, only two components necessary for the formation of one layer of $DyBa_2Cu_3O_7$ are supplied to the substrate. This is radically different from the other deposition techniques (e.g. FIG. 2), where at this point half a layer of nucleated $DyBa_2Cu_3O_7$ material 24, dispersed in small grains with local impurities 25, is present. Finally, the last block layer 83 consisting of three monolayers of CuO is deposited. Only at this point can the phase formation of the desired compound 94 start, as the estimated vertical diffusion lengths at 700° C. for Cu, Ba and Dy are 60, 2 and 0.2 nm, respectively. In the example, Cu must diffuse through the existing matrix of BaO and $Dy_2O_3$ to build $DyBa_2Cu_3O_7$. As more and more Cu is deposited, the matrix will completely transform. Therefore, the growth direction of the crystal is mainly vertical with only a small, or even without, lateral component, in contrast to the lateral growth direction characteristic of the simultaneous deposition techniques. At the end of the transformation, a $DyBa_2Cu_3O_7$ layer 94 is formed with a roughness (smoothness) comparable to that of the first deposited block layer 81 (FIG. 8) and with no inclusions of other phases.

In accordance with the new method, the process can be repeated and a new period of blocks (81, 82, 83) deposited after the completion of one layer of $DyBa_2Cu_3O_7$ 94. This is demonstrated by FIG. 10. What has been described previously is exactly repeated during this next deposition period. These periods of layers 81, 82, 83 can be repeated as often as necessary, until the required thickness of the film is achieved. Even though in case of $DyBa_2Cu_3O_7$ 94 the order of layers is kept for the second and the periods following, it may be necessary or advantageous to change this order to achieve, for example, a better matching with crystal lattice of the superconducting material, which now serves as substrate for the newly deposited layers. As indicated by FIG. 11, it is possible to choose different thicknesses of the layers, still in accordance with the stoichiometric ratio. In the illustrated case a layer 111 of BaO, consisting of three monolayers, a layer 112 of $Dy_2O_3$, consisting of 1.5 monolayers, and a layer 113 of CuO, consisting of 4.5 monolayers, is deposited.

EXAMPLE

Using this new deposition technique, a series of $DyBa_2Cu_3O_7$ films of 20 nm thickness, with good superconducting properties ($T_{co}=86K$) has has been prepared. Dy, Ba, and Cu were evaporated from their effusion cells, oxidized and deposited on the substrate ($SrTiO_3$). A quartzmicrobalance monitored the layer deposition and was used to control the shutter at each effusion cell. The same microbalance was used to terminate deposition after reaching the final thickness of the film. The substrate temperature and the oxygen pressure were fixed to 700° C. and $1.3 \times 10^{-4}$ Pa, respectively, throughout the entire process. The oxygen losses were balanced by a stream of $10^{15}$ atoms per $cm^2$ and second into the deposition chamber, generated by a radio frequency plasma source. The period of block layers (81, 82, 83 in FIGS. 8 and 10) consisted of the simple oxides $BaO-Dy_2O_3-CuO$, starting with BaO.

The previously described growth behavior for this example was completely consistent with the RHEED data measured during the deposition of the blocks. In fact, at the end of each deposition period (within the final seconds of the CuO deposition), the 'birth' of a $DyBa_2Cu_3O_7$ layer 94 (FIG. 9) was observed by the appearance of strong streaks. Evidence for the presented method was further provided by cross-section TEM (transmission electron microscopy) data, which showed the absence of inclusions over large domains (1000 nm) and a roughness which was limited to ±1 unit cell. This difference was particularly obvious when large domain cross-sections of films prepared in accordance with the invention are compared with cross-sections of films prepared with prior art techniques. Finite size oscillations in the x-ray diffraction spectra of these films confirmed, that the roughness was limited to ±1 unit cell by using the new method.

We claim:

1. Process for manufacturing a thin film of a solid compound of a high Tc superconductor from a plurality of base materials by periodic multilayer deposition on a substrate with the layer thickness ratio within each period being selected in accordance with the stoichiometric ratio of said solid compound, comprising the steps of:

depositing a first layer on said substrate, depositing a second layer on said first layer;

depositing a third layer on said second layer;

the thickness of the thickest layer of said first layer, said second layer and said third layer is selected from a range between 2 and 20 monolayers;

crystallizing said period of layers at an approximately constant temperature to said compound; and wherein said crystallizing said period of said layers to said compound is completed before depositing the next period of said layers.

2. A process in accordance with claim 1, wherein said period of layers comprises greater than two layers.

3. A process in accordance with claim 1, wherein two of said base materials are combined to form a binary compound before being deposited as one of said layers.

4. A process in accordance with claim 1, wherein the order of said layers within said period of layers is changed within subsequent deposition period of layers.

5. A process in accordance with claim 1, wherein said base materials are selected from the group consisting of group Ib, IIa-, IIIa-metals, Lanthanides, potassium, lead and their oxides.

6. A process in accordance with claim 1, wherein said period of layers are deposited by a method selected from the group consisting of molecular beam epitaxy (MBE), sputtering, laser ablation and metal-organic chemical vapor deposition (MOCVD).

7. A process in accordance with claim 1, wherein said compound has a unit cell with at least one axis exceeding 1 nm.

* * * * *